United States Patent
Cole et al.

[11] Patent Number: 6,125,425
[45] Date of Patent: *Sep. 26, 2000

[54] MEMORY CONTROLLER PERFORMING A MID TRANSACTION REFRESH AND HANDLING A SUSPEND SIGNAL

[75] Inventors: Michael Cole, Chandler; David Puffer, Tempe, both of Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/625,066

[22] Filed: Mar. 29, 1996

[51] Int. Cl.$^7$ .................................................. G11C 11/406
[52] U.S. Cl. ........................... 711/106; 365/222; 711/167; 710/35
[58] Field of Search ..................................... 711/105, 106, 711/154, 167; 395/293; 365/222; 710/113, 34, 35; 713/502

[56] References Cited

U.S. PATENT DOCUMENTS

| | | | |
|---|---|---|---|
| 5,265,212 | 11/1993 | Bruce, II .................................. | 395/293 |
| 5,329,629 | 7/1994 | Horst et al. ................................. | 711/5 |
| 5,345,577 | 9/1994 | Chan et al. ................................ | 711/106 |
| 5,418,920 | 5/1995 | Kuddes ................................... | 711/106 |
| 5,430,680 | 7/1995 | Parris ..................................... | 365/222 |
| 5,438,666 | 8/1995 | Craft et al. ................................. | 710/22 |
| 5,448,742 | 9/1995 | Bhattacharya ........................... | 711/154 |
| 5,479,372 | 12/1995 | Sato et al. ............................... | 365/222 |
| 5,630,163 | 5/1997 | Fung et al. .............................. | 710/127 |
| 5,636,367 | 6/1997 | Stones et al. ............................. | 711/167 |
| 5,638,529 | 6/1997 | Yee et al. ................................. | 711/106 |
| 5,659,515 | 8/1997 | Matsuo et al. ........................... | 365/222 |
| 5,682,498 | 10/1997 | Harness ................................... | 711/106 |

*Primary Examiner*—Hiep T. Nguyen
*Assistant Examiner*—Gary J. Portka
*Attorney, Agent, or Firm*—Blakely, Sokoloff, Taylor & Zafman LLP

[57] ABSTRACT

A method and apparatus for performing a mid transaction refresh of DRAM and handling a suspend signal from a master. A timer is used to provide a refresh request at predetermined intervals. The refresh request is made to a DRAM state machine. The DRAM state machine performs a DRAM refresh responsive to the refresh request. The refresh is performed by manipulating the RAS and CAS signal while showing a master of the transaction a series of wait states.

The suspend signal from the master is received by a DRAM state machine. The DRAM state machine will loop within its then current state as long as the suspend signal is asserted. The RAS, CAS and other control signals are maintained in the states existing when the suspend signal was asserted unless external signals (e.g., a refresh request) force a change in state of the control signals. At least one CAS state machine handles the assertion of CAS. The CAS state machine is suspended responsive to the suspend signal and will bounce between a suspend state and a predetermined state as long as the suspend signal is asserted. The CAS state machine will be suspended if at all before the falling edge of a write transfer, or before the rising edge of a read transfer.

13 Claims, 17 Drawing Sheets

RAS PRECHARGE WAIT STATES

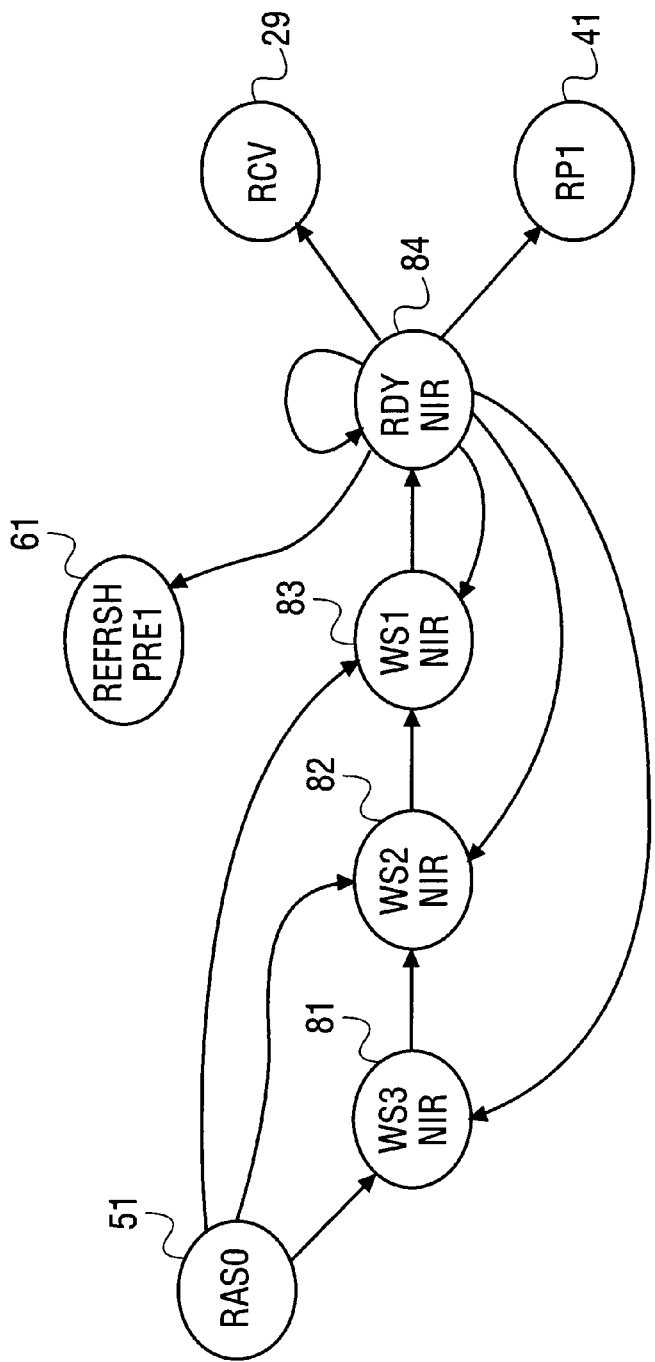

CAS STATES - FPM INTERLEAVED READ

CAS STATES - FPM INTERLEAVED WRITE

CAS STATES - (B)EDO TRANSACTIONS

MEMORY CONTROLLER PERFORMING A MID TRANSACTION REFRESH AND HANDLING A SUSPEND SIGNAL

BACKGROUND OF THE INVENTION

(1) Field of the Invention

The invention relates to memory controllers. More specifically, the invention relates to memory controllers having a mid-transaction refresh capability and the ability to handle a master not ready signal.

(2) Prior Art

Accessing dynamic random access memory (DRAM) is generally well known in the art. In a typical DRAM access a memory controller receives an address from a master seeking the access. The address is decoded and mapped to form a row address and a column address. The memory controller then asserts a row address strobe (RAS) and the row address is strobed into the DRAM from the memory address (MA) lines of the DRAM. After the row address has been received, while maintaining RAS asserted, the column address is strobed into the DRAM from the MA lines by the assertion of a column address strobe (CAS). Each assertion of CAS corresponds to one transfer. If the transfer is a read, the data corresponding to the specified address is driven onto the data lines after CAS is asserted, and the master reads the data some time after it becomes valid. If the transaction is a write, data is written to the specified address on the falling edge of CAS.

Multiple accesses can be performed within one transaction. This is referred to as bursting. In a burst transaction RAS is maintained asserted and CAS is repeatedly asserted and deasserted equal to the number of transfers desired. The column address must be incremented after each transfer to prevent overwrites during the burst.

DRAM is typically refreshed at least once every 15.6 microseconds, the period between refreshes in a system being the refresh period. In the past, typical DRAM systems have had maximum transaction lengths which are only a small fraction of the refresh period. For example, a design employing an Intel i960® microcontroller has a maximum burst length of no more than four words. Thus, maximum transaction latency is so small as a percentage of the refresh period that a refresh rate can be set easily to accommodate a worse case scenario. As demand for increased throughput has grown, the burst length of various devices such as direct memory access (DMA) controllers have increased dramatically such that the above strategy is no longer viable on such high throughput systems. Taking, for example, a DRAM transaction in which a DMA bursts 512 words to a DRAM, such transaction could have a wait state profile of 7-3-3-3 . . . +4 RAS precharge states. Accordingly, even excluding master inserted wait states the transaction will require 1,544 cycles to complete. At 33 MHz, 1,544 cycles translate into 46.3 microseconds. As mentioned above, 46.3 microseconds is nearly three times the typical maximum time between refreshes. Some prior art systems have attempted to address this problem by forcing the master off the bus at regular intervals to allow a refresh to take place. Thus, large transactions are broken up into several smaller transactions. Many transactions are not well suited to be arbitrarily broken up based on a desired refresh rate. Moreover, breaking up the transaction increases overhead including bus arbitration, and any other overhead paid on a per transaction basis. Resource availability may also be an issue, e.g., where ownership of the resource must be obtained for the transaction to occur (writing to shared memory usually requires ownership of a synchronization object such as a mutex). Additionally, since the refresh is not transparent to the master, design of the master is more complicated.

Additionally, many prior art memory controllers are incapable of accommodating a "master not ready signal" which suspends the transaction without requiring the master to relinquish the bus. In such prior art systems, if the data was not available to be written at the expected time or the master was not prepared to read data at the appropriate time, invalid transactions resulted or the master was forced off the bus and required to come back later. One approach to handling the possibility of a master not ready is to introduce local buffering between the DRAM and the master. In this manner, the master can post DRAM writes to the buffers. Posted writes can then be written out to DRAM at leisure by the memory controller. This approach requires a large amount of logic and results in relatively high DRAM read latency. This approach is widely used in personal computer chip sets, but it is not suitable for use in pin constrained systems as it requires two complete interfaces one between the MCU memory and one between the local bus and the MCU.

Where pin constraints are an issue, the DRAM has typically been connected to the data lines of the local bus of the host processor. Connecting the DRAM directly to the data lines reduces the logic required as well as the latency of DRAM reads. However, as no buffering is provided, write posting is not possible. Since data automatically appears on the data lines from the DRAM in the case of a read, and, whatever is on the data lines during a write goes directly to memory, some accommodations must be made if the master needs to suspend the transaction. This required accommodation necessitates dynamic control of the memory controller's control signals.

In view of the foregoing, it is desirable to be able to provide a memory controller supporting a master not ready condition and mid-transaction refresh.

BRIEF SUMMARY OF THE INVENTION

A method and apparatus for performing a mid transaction refresh of DRAM and handling a suspend signal from a master is disclosed. A timer is used to provide a refresh request at predetermined intervals. The refresh request is made to a DRAM state machine. The DRAM state machine performs a DRAM refresh responsive to the refresh request. The refresh is performed by manipulating the RAS and CAS signal while showing a master of the transaction a series of wait states.

The suspend signal from the master is received by a DRAM state machine. The DRAM state machine will loop within its then current state as long as the suspend signal is asserted. The RAS, CAS and other control signals are maintained in the states existing when the suspend signal was asserted unless external signals (e.g., a refresh request) force a change in state of the control signals. At least one CAS state machine handles the assertion of CAS. The CAS state machine is suspended responsive to the suspend signal and will bounce between a suspend state and a predetermined state as long as the suspend signal is asserted. The CAS state machine will be suspended, if at all, before the falling edge of a write transfer, or before the rising edge of a read transfer.

BRIEF DESCRIPTION OF THE DRAWINGS

FIGS. 5a–e show the state diagrams of the CAS assertion states of the DRAM state machine of FIG. 3 for different DRAM types.

DETAILED DESCRIPTION OF THE INVENTION

Figure 1:
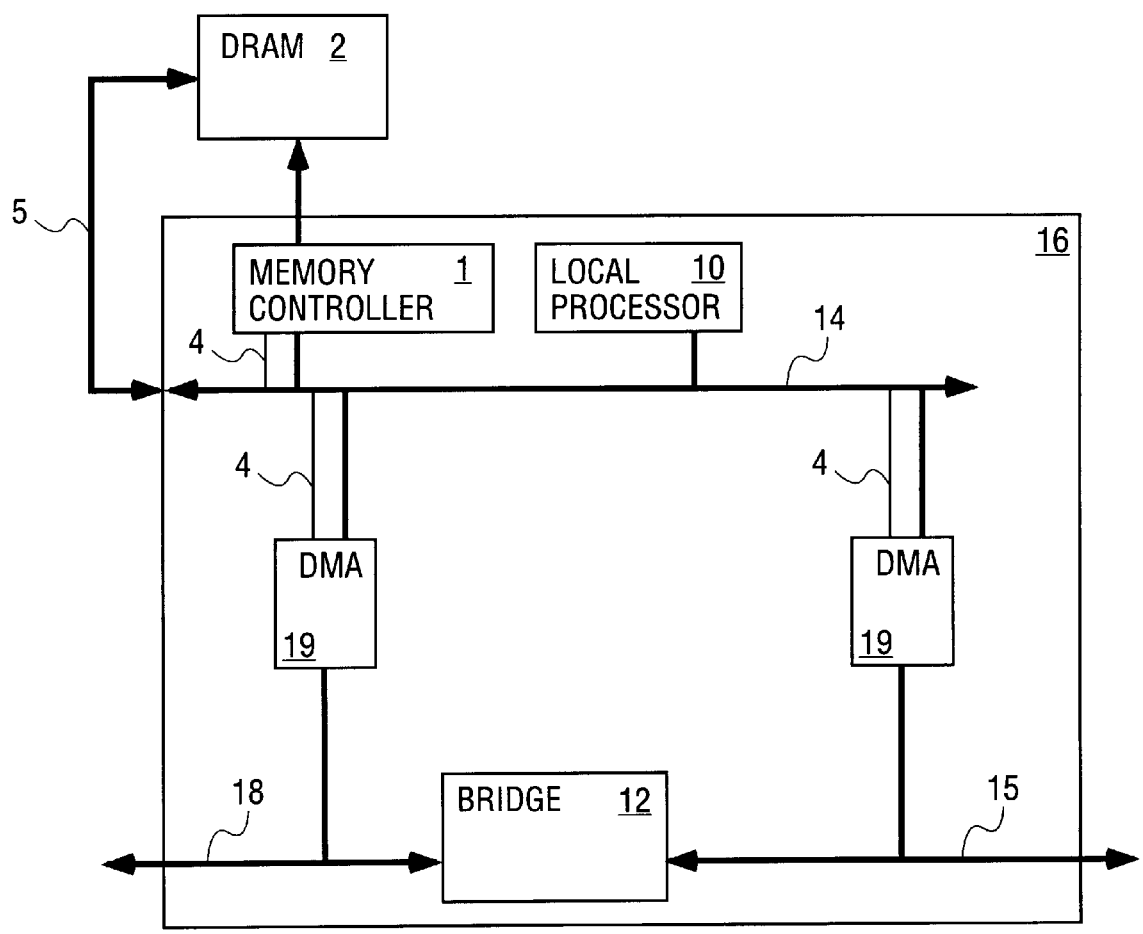
FIG. 1 shows a block diagram of a system employing the memory controller of one embodiment of the invention.

FIG. 1 shows a system of one embodiment of the invention. A local processor 10 is coupled to local bus 14. The address and data lines 5 of the local bus 14 are coupled directly to DRAM 2. Memory controller 1 is disposed on the local bus 14 and coupled to DRAM 2. Memory controller 1 controls accesses by all local bus masters to the DRAM 2. A primary DMA controller 19 and a secondary DMA controller 11 are each disposed between an input/output bus and the local bus 14. Both DMA controllers can burst read and writes from and to the DRAM 2. Here, the input/output buses are primary peripheral component interconnect (PCI) bus 18 and secondary PCI bus 15, respectively. Primary PCI bus 18 is coupled to a secondary PCI bus 15 through a PCI-to-PCI bridge 12. Both the DMA controllers 11, 19 can assert a suspend signal 4 which is included as an extension of the local bus 14 and coupled to the memory controller 1. The suspend signal 4 has the effect of suspending the transaction in process without requiring the master to relinquish the local bus 14. The suspend signal 4, while asserted, indicates that the master (e.g., DMA controller 19) is not ready to receive data during a read transaction or that the data on the bus is invalid during a write transaction. Assertion of the suspend signal will maintain the state of the control signals from the memory controller to the memory. Significantly, the suspend signal will suspend transactions with DRAM, SRAM, or any other memory type. In the embodiment of FIG. 1, the local processor 10 memory controller 1 DMAs 11 and 19 and the PCI-to-PCI bridge all reside on a single chip 16. In one exemplary embodiment, the architecture is that described in the Intel i960® RP Microprocessors Users Manual available from the publications division of Intel Corporation of Santa Clara, Calif.

Figure 2:
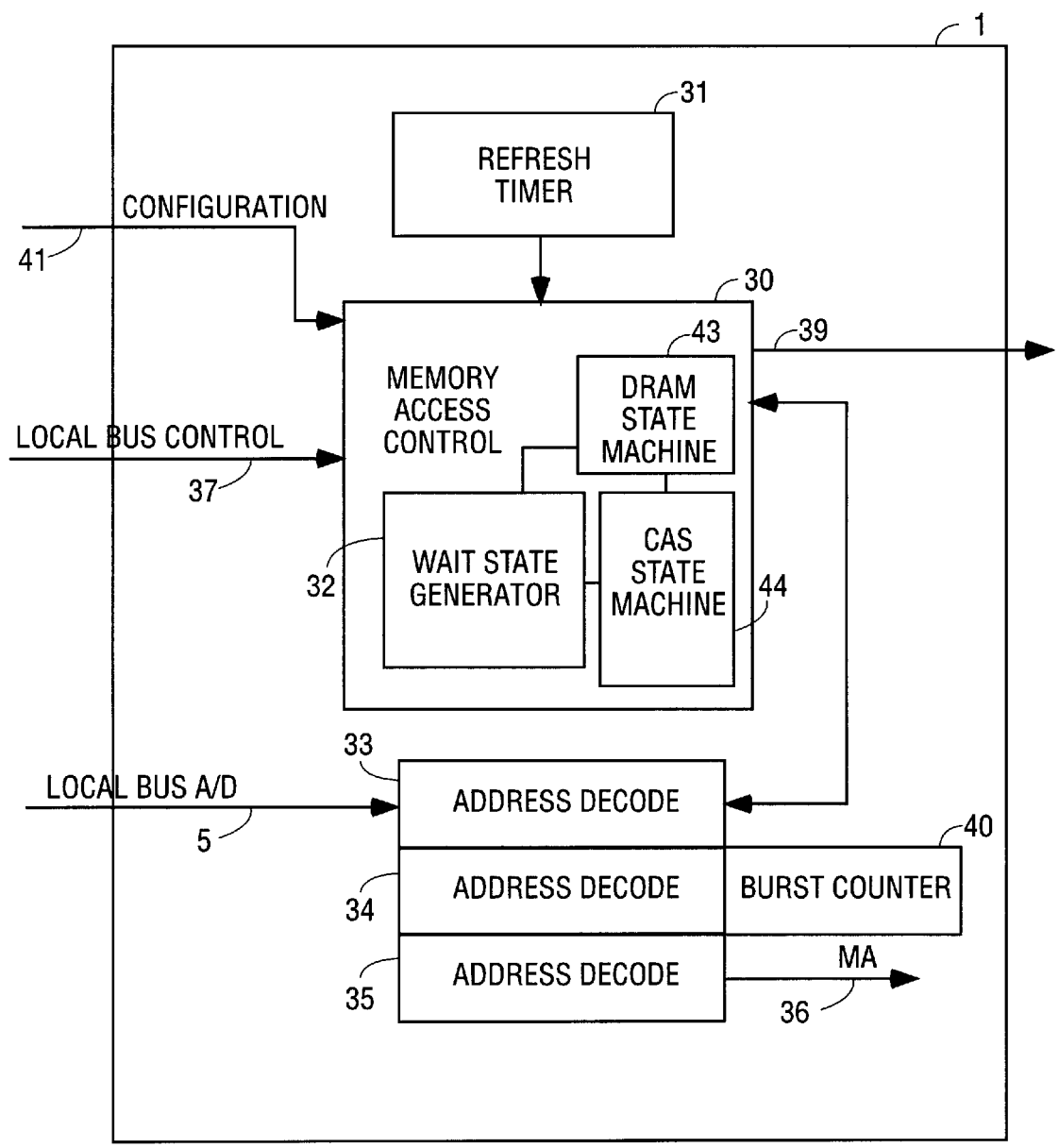
FIG. 2 shows a block diagram of the memory controller of one embodiment of the invention.

FIG. 2 shows a block diagram of the memory controller 1 of one embodiment of the invention. A refresh timer 31 is coupled to a memory access control unit 30. The memory access control unit 30 includes a wait state generator 32, a DRAM state machine 43, and one or more CAS state machines 44. In one exemplary embodiment, the wait state generator is incorporated implicitly into the DRAM state machine 43 and CAS state machine 44. Memory control signals 39 include RAS, CAS, and READY/RECOVER (RDY/RCV). The DRAM state machine 43 is responsible for other assertions of RAS and RDY/RCV but not CAS (RDY/RCV is asserted on the local bus, not to DRAM). The CAS state machine(s) 44 assert CAS, but the DRAM state machine 43 tracks the CAS assertion and maintains synchronization as CAS is asserted.

Local bus control signals 37 provide inputs to the memory access control unit 30. System configuration information 41 including, but not limited to, type, size, and speed of DRAM is also provided. This configuration information 41 could be stored in registers within the memory controller or provided to the memory controller from an external source. A bus monitor (not shown) and/or parity generator (not shown) may also be provided as part of the memory controller to improve reliability in the event of transmission failure. An address decode unit 33 receives a local bus address/data lines 5. Once an address on the local bus has been decoded by the address decode unit 33, that address is latched into address register 34 and can be strobed out onto the memory address (MA) lines 36 via the address multiplexer 35. Burst counter 40 increments the address in the address register 34 during bursts. The memory access control unit is also notified that it "owns" the address space for the transaction. The address multiplexer multiplexes the row address and the column address for appropriate addressing of the DRAM. The burst counter increments the column address after each transfer.

Figure 3:
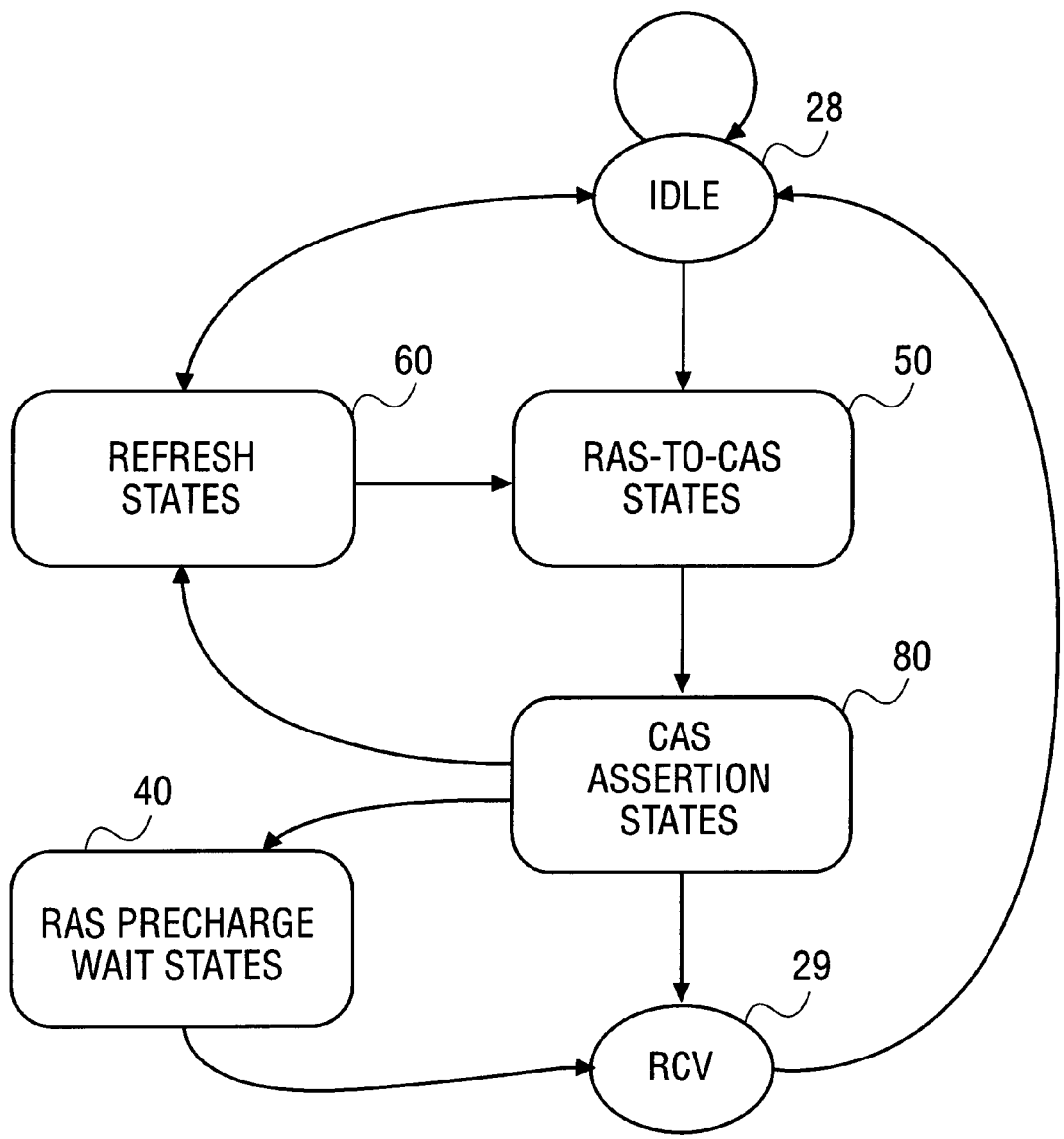
FIG. 3 shows a state diagram of a DRAM state machine of one embodiment of the invention.

FIG. 3 shows a state diagram of the DRAM state machine of one embodiment of the instant invention in which the wait state generator is incorporated implicitly. Wait states shown as part of the DRAM state machine (and below in the CAS state machines) could be replaced with externally generated wait states without departing from the scope and contemplation of the invention. From an IDLE state 28, the DRAM state machine can transition to refresh states 60 or RAS-to-CAS states 50. From the refresh states 60, the state machine can transition back to IDLE 28 or to the RAS-to-CAS states 50. From the RAS-to-CAS states 50, the state machine must transition to CAS assertion states 80. From CAS assertion states 80, the DRAM state machine can transition to refresh states 60, RAS precharge wait states 40 or recover state 39. Refresh states 60, RAS-to-CAS states 50, and RAS precharge wait states 40 are detailed more fully in connection with FIGS. 4a–c. The CAS assertion states 80 are dependent on the type of DRAM in the system and are detailed in FIGS. 6a–c.

Figure 4A:
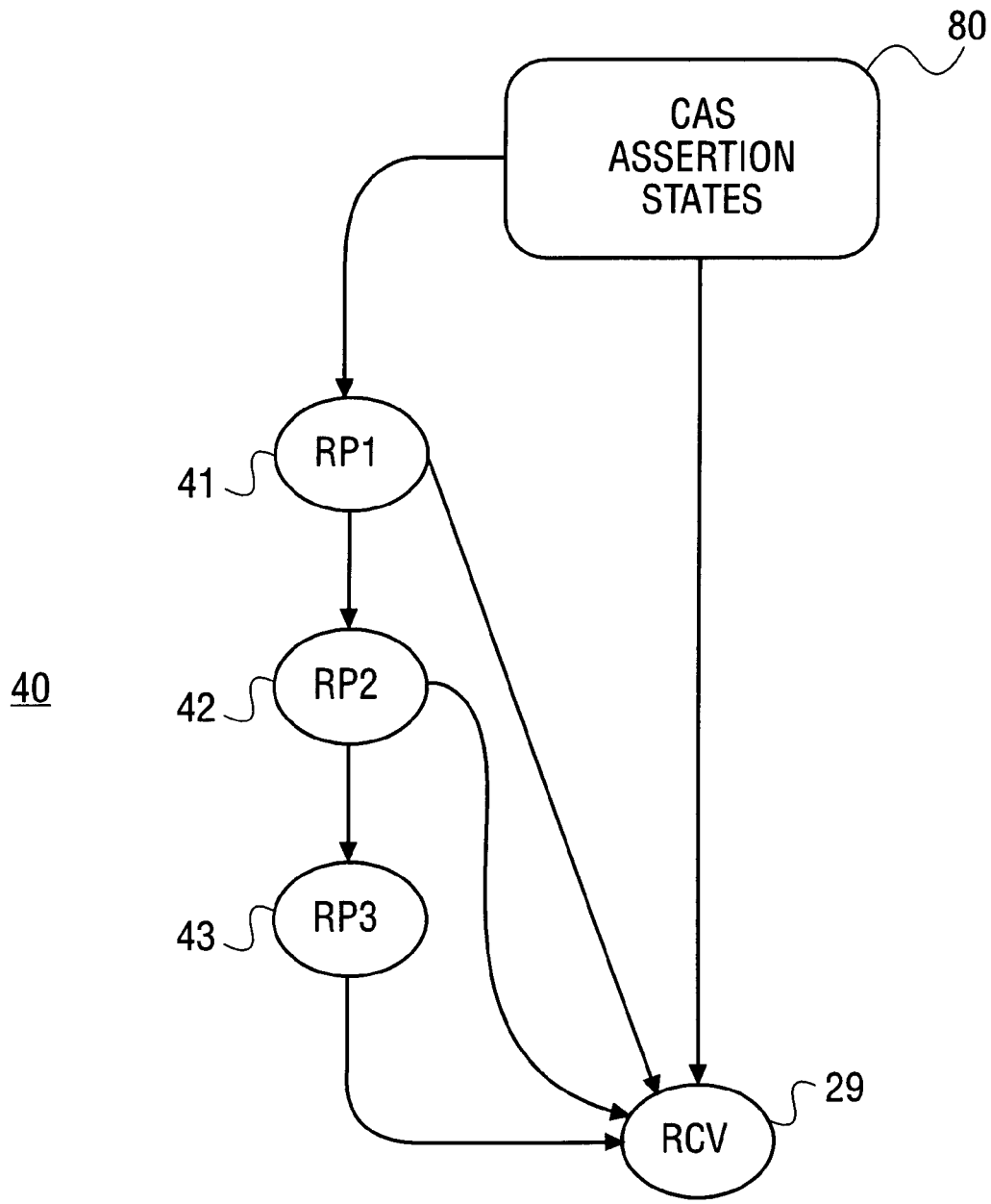
FIG. 4a shows a state diagram of the RAS precharge states of the DRAM state machine of FIG. 3.
Figure 4B:
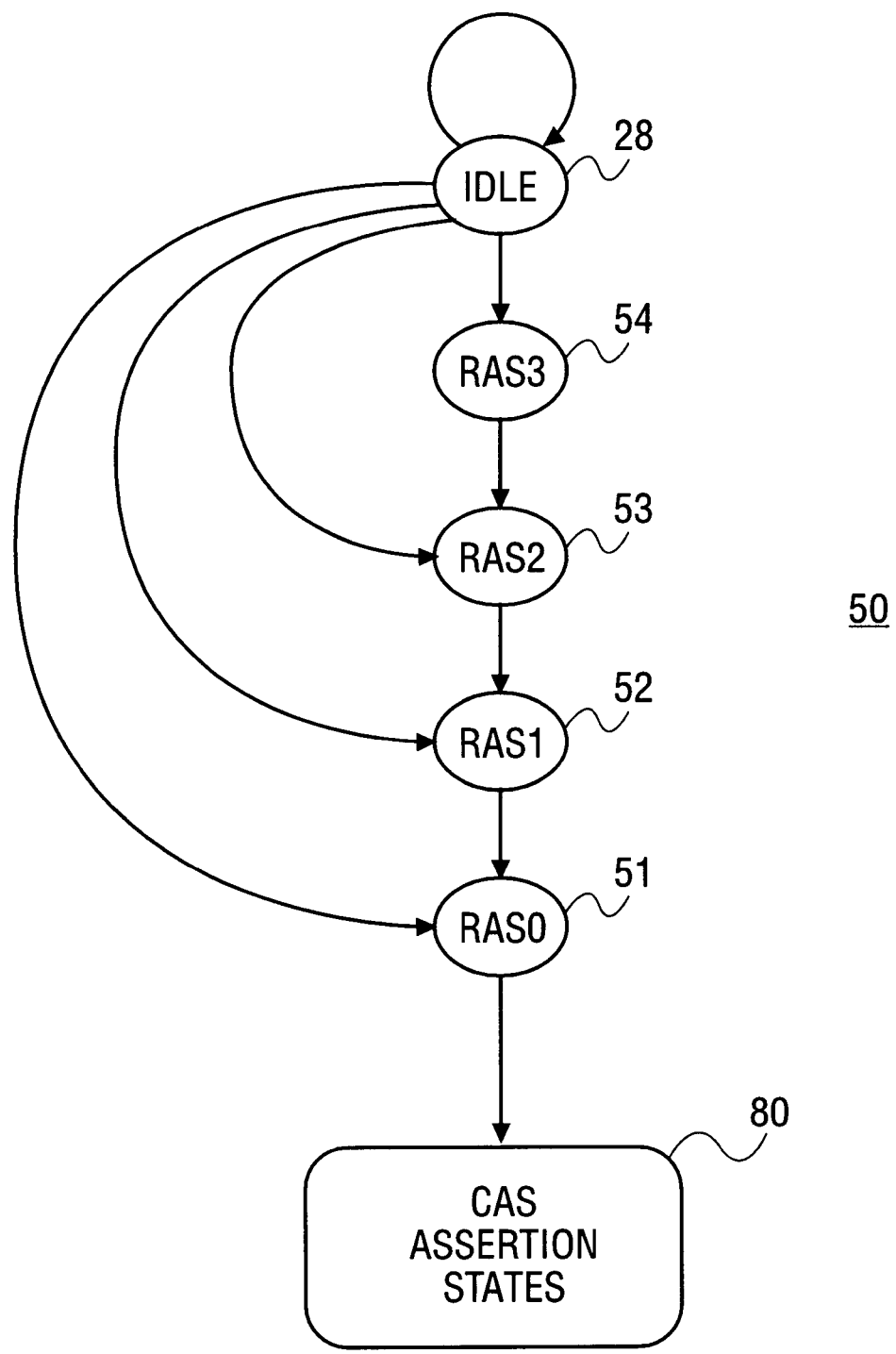
FIG. 4b shows a state diagram of the RAS-to CAS state of the DRAM state machine of FIG. 3.
Figure 4C:
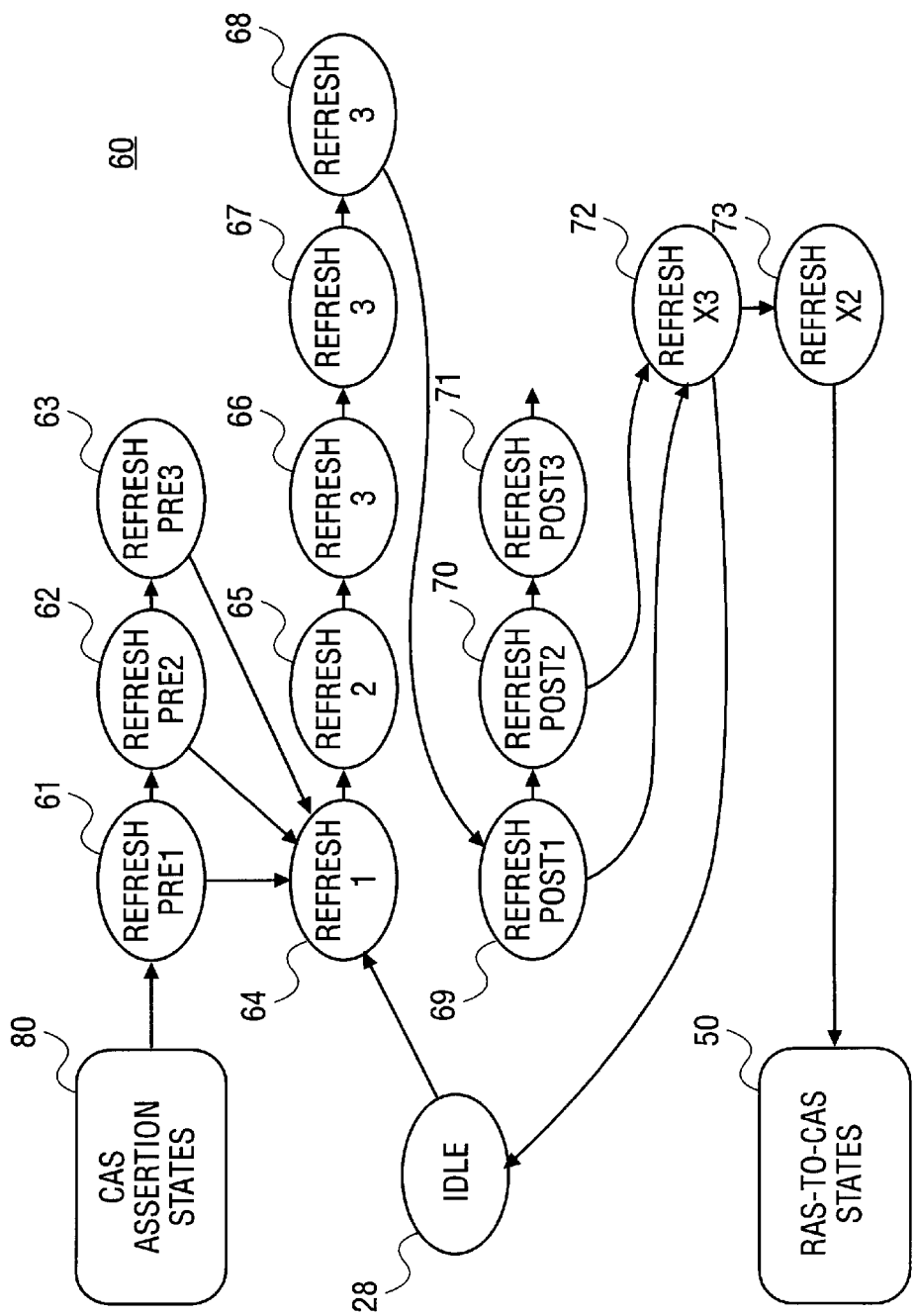
FIG. 4c shows a state diagram of the refresh states of the DRAM state machine of FIG. 3.

FIGS. 4a–c are state diagrams corresponding to RAS precharge wait states 40, RAS-to-CAS states 50 and refresh states 60, respectively. Significantly, the DRAM state machine operates on the local bus clock (LCK). Each state of the state diagram corresponds to one LCK clock cycle. In the shown embodiment, the RAS precharge states 40 consists of three precharge states: RP1 41, RP2 42 and RP3 43. The number of precharge states employed by a particular system will depend on the systems required precharge time. Once the RAS is precharged, the state machine transitions to RECOVER state 29 while in this embodiment three RAS precharge states 41–43 are shown, additional precharge states could be added or the number of precharge states could be reduced, without departing from the scope and contemplation of the invention.

FIG. 4b shows the RAS-to-CAS states which can be entered either from the IDLE state 28 or the refresh states (not shown). Four states of RAS assertion are shown: RAS0 51, RAS 1 52, RAS2 53 and RAS3 54. These are states during which RAS is asserted before the first CAS pulse (of course, RAS remains asserted during CAS assertion). The number of RAS assertion states is dictated by the required time RAS must be asserted for the particular DRAM used. Introduction of additional RAS assertion or subtraction of RAS assertion states does not depart from the scope of contemplation of the invention. Once the RAS has been adequately asserted the state machine transitions into the CAS assertion states 80.

FIG. 4c shows the refresh states 60 of the DRAM state machine 43. The refresh states 60 can be entered from the CAS assertion states 80 or IDLE 28. When refresh states are entered from CAS assertion states 80 this usually implies a mid-transaction refresh. Refresh PRE1 61, refresh PRE2 62 and refresh PRE3 63 are provided to allow the RAS to precharge before the actual refresh begins. The worst case assumes that RAS has just been deasserted in connection with an ongoing transaction the number of precharge state is configuration dependent (e.g., for a particular system, the number of precharge states will be the same for any read or any write). Once RAS is precharged the state machine transitions through five cycles of refresh, refresh1–refresh5 64–68 during which a CAS-before-RAS refresh is performed. From refresh5 68 the state machine can transition to either refresh POST1 69 or refresh EXIT1 72. Refresh POST2 70 and refresh POST3 71 may be transitioned through to allow additional precharging of the RAS before re-entering the transaction or returning to the IDLE state 28. In the case of a mid-transaction refresh the state machine transitions from refresh EXIT1 72 to refresh EXIT2 73 before returning to the RAS-to-CAS states 50.

FIGS. 5a–e show the CAS assertion states 80 of the DRAM state machine 43. While the bulk of the state machine 43 is shared regardless of DRAM type and transaction type, the CAS assertion states 80 vary by DRAM type and transaction type. A CAS assertion state is always entered from RAS0 51. Wait states (WS) vary in number depending on the length of time CAS must be asserted. As indicated above, the DRAM state machine is not responsible for asserting CAS but it tracks the assertion of CAS and coordinates the DRAM refresh.

FIG. 5a shows the CAS states for fast page mode (FPM) non-interleaved read (NIR). This portion of the state machine includes three wait states: WS3 NIR 81, WS2 NIR 82, WS1 NIR 83. These states correspond to wait states during which CAS is asserted. The number of wait states actually asserted would depend on the requirements of the particular DRAM as indicated to the memory controller by the configuration information. During READY NIR 84 data is being driven on the datalines and the refresh request is checked. If at READY 84 a refresh is requested the transfer occurs and state machine transitions to refresh PRE 1 61. If at READY 84 a suspend signal is not asserted and BLAST is asserted the transaction will be finished before refresh. BLAST is a status signal indicating that the last transfer of a transaction is occurring. When the transaction completes, state machine transitions to recover 39. Because the transfer occurs regardless once the READY state 84 is reached it is essential in this embodiment that the suspend signal be asserted, if at all, only at the beginning of the transfer. For example, in transactions of the form WS2 NIR 82 to WS1 NIR 83 to READY NIR 84 and back to WS2 NIR 82 for the next transfer, if the suspend signal is not asserted in WS2 82 it will not be asserted during that transfer.

Figure 5B:
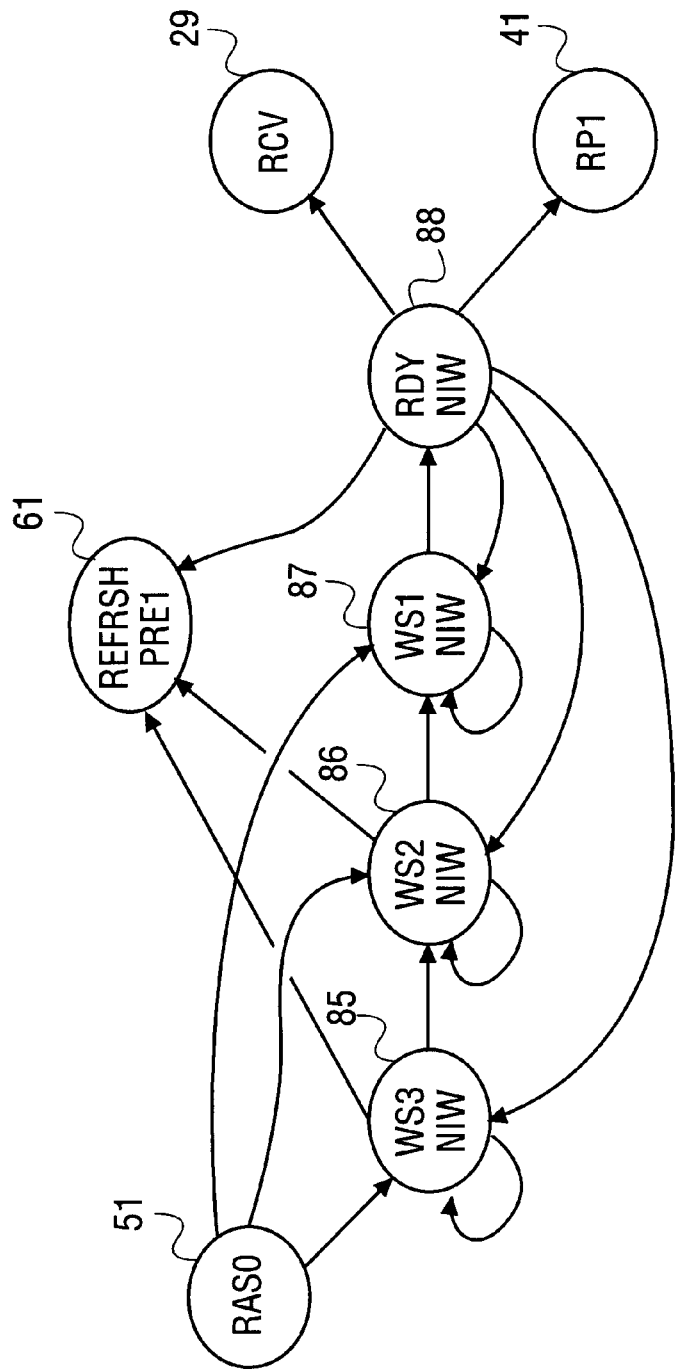

FIG. 5b shows the CAS states for FPM non-interleaved write (NIW). Again, three wait states 85, 86 and 87 are provided followed by a READY NIW state 88. Significantly, because writes occur on the falling edge of CAS, once a transfer begins, it must be completed before a DRAM can be refreshed or the suspend signal asserted. Thus, if the suspend is asserted the first wait state of a transfer transitions to itself until the suspend signal is deasserted. For example, in a transaction of the form WS2 86 to WS1 87 is READY 88 and back to WS2 86. The suspend signal can only be asserted in WS2 86. Moreover, it is only in the initial wait state that a refresh request can be acknowledged and a refresh carried out. This is compared with a read in which the state machine transitions to READY and READY transitions to itself while the suspend signal is asserted or a refresh is requested.

Figure 5C:
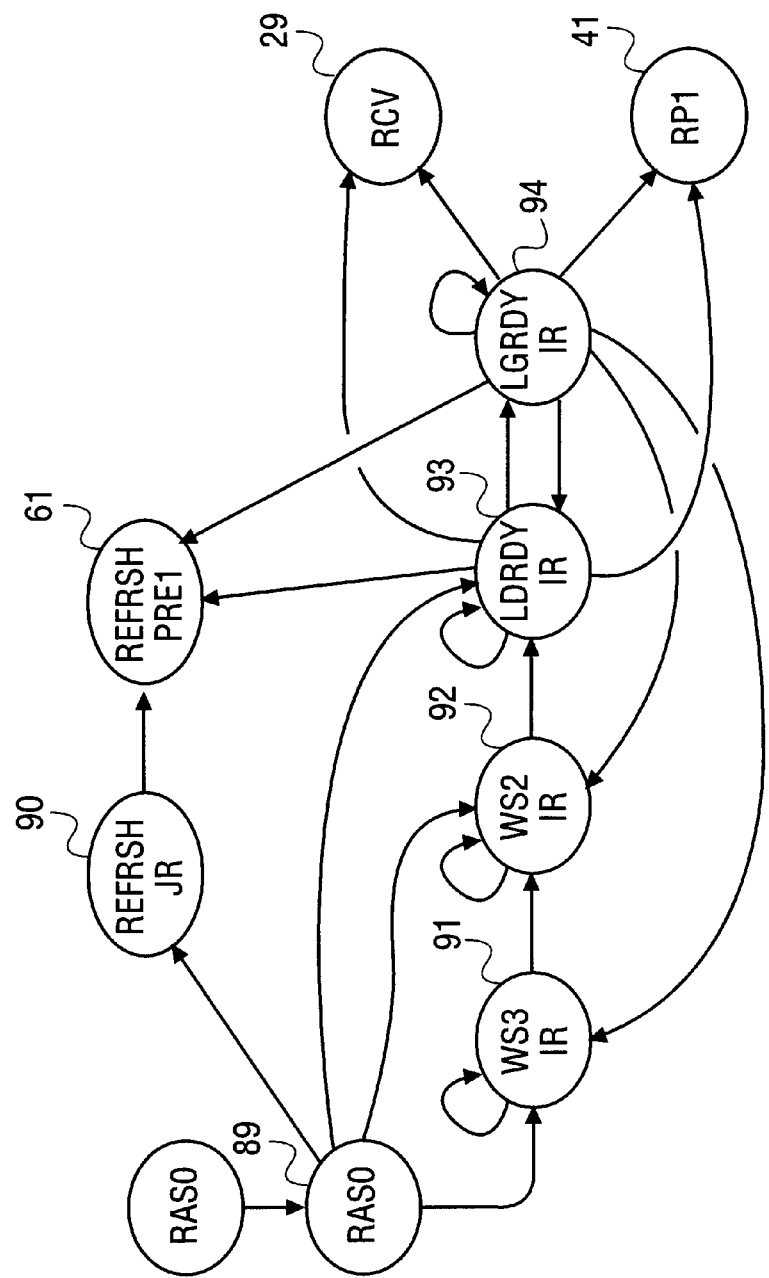

FIG. 5c shows the CAS states FPM interleaved read (IR). An initial wait state (WSI) 89 provides to a single wait state for lead bank setup as the interleaved read begins. Additional wait states WS3 91 and WS2 92 are provided in an event that the DRAM banks are slow and require more than one wait state between LAG transfers and LEAD transfers of a transaction. However, in the interleaved format, the LEAD READY state 93 and LAG READY state 94 create an effective wait state for each other. Thus, it is possible to do zero wait state bursted reads from an interleaved DRAM. The LEAD READY state 93 and LAG READY state 94 transition to themselves when the suspend signal is asserted. If a refresh request is asserted at either ready state the transfer will complete and a transition to refresh PRE1 61 will occur. Refresh interleave read 90 is provided as a transitional state between the initial wait state and refresh PRE1 61.

Figure 5D:
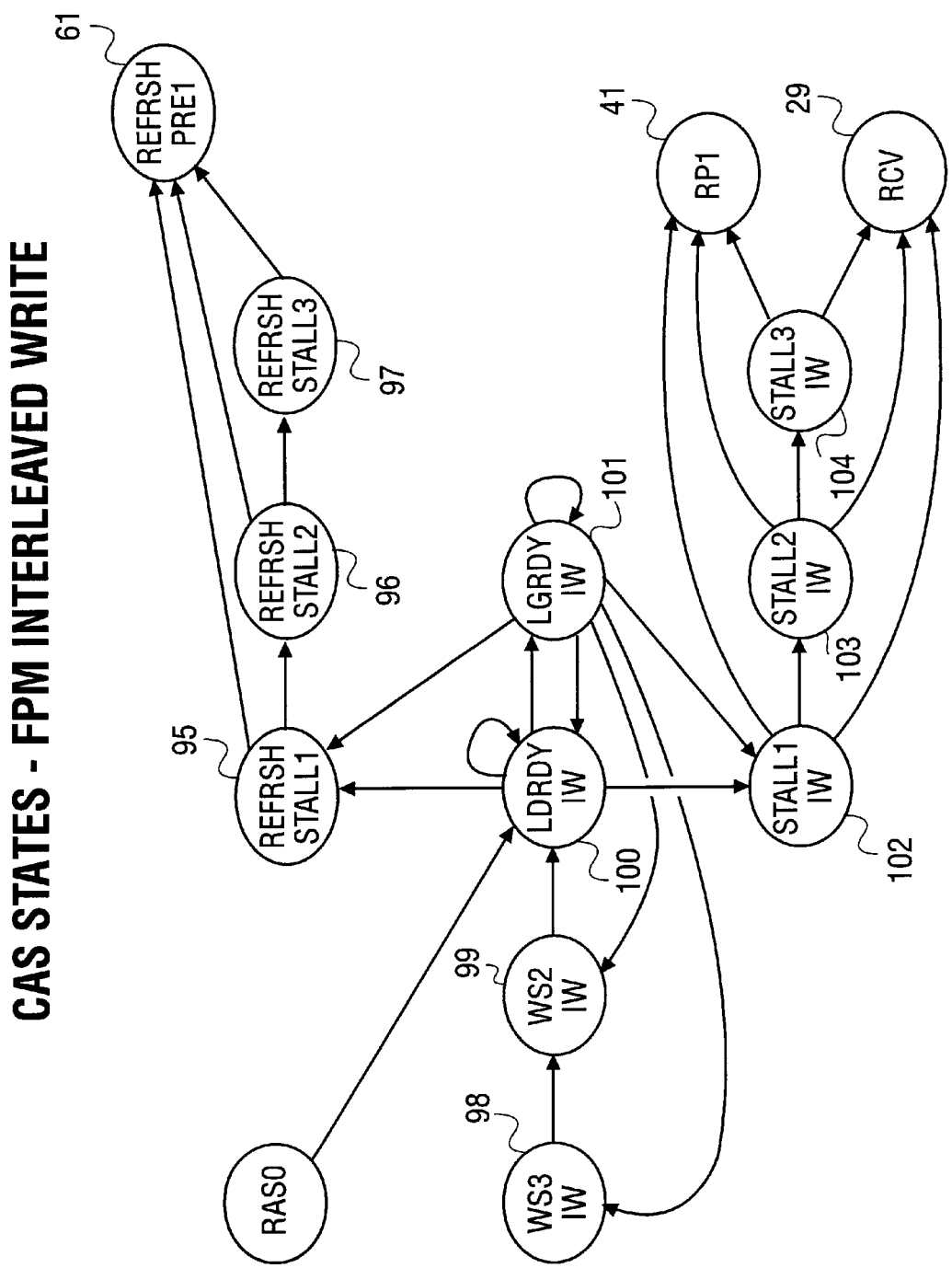

FIG. 5d shows the CAS states for fast page mode interleaved write (IW). Because CAS assertions are entered from RAS0, at LEAD READY 100, LEAD READY 100 will transition to itself if the suspend signals are asserted. If a refresh request is asserted, the state machine will transition to the refresh STALL states 95–97 which allow the transfer to complete before entering refresh. If the transfer which took place at LEAD READY 100, it is the last transfer of the transaction the state machine will transition to the STALL states 102–104 prior to going to RECOVER, or RAS precharge for the next transaction. If the transaction is to continue with additional writes, the state machine transitions to LAG READY 101 which in addition to all the possible transitions discussed in connection with the LEAD READY 100 state can transition to the additional wait state 98 and 99 in the event existing DRAM is incapable of zero wait state bursts. If the interleave DRAM in the system is capable of zero wait state bursts, the state machine will bounce back and forth between the LEAD READY 100 and LAG READY 101 states until one of the previously discussed conditions exist (e.g., refresh or transaction end).

Figure 5E:
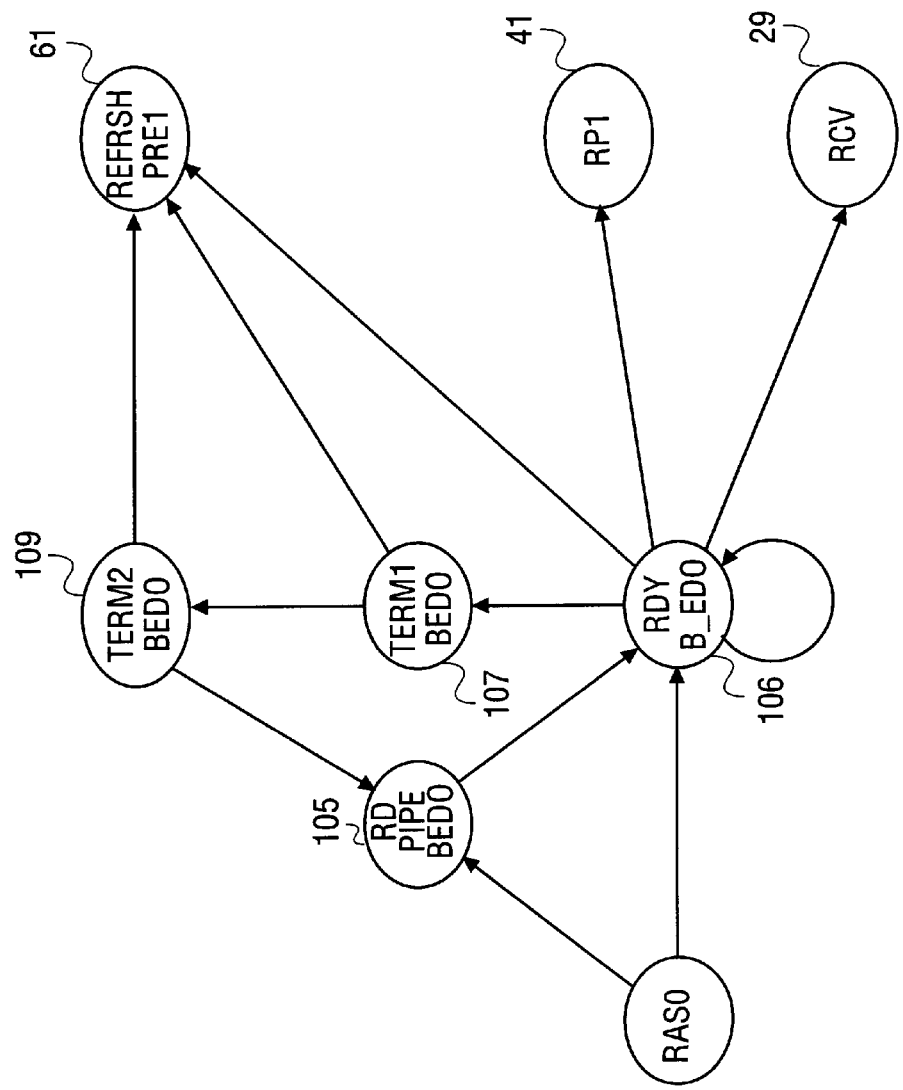

FIG. 5e shows the CAS states for the (B)EDO transactions. This section of the CAS assertion state handles all burst extended data out (BEDO) and extended data out (EDO) transactions. From RAS0 a state machine will transition into READ PIPE BEDO 105 if, and only if, the transaction is a read and is a BEDO transaction. Either after transitioning through state 105 or directly from RAS0, a state machine will transition to READY B_EDO 106 in which it will remain until one of the following conditions occurs: 1) refresh is requested, 2) the transaction ends, or 3) the transaction is a BEDO transaction and the address of an initial transfer is not quad-word-aligned and burst through the next quad-word-aligned. If proper alignment does not exist, it will terminate by transitioning through termination states 107 and 108 before re-entering READ PIPE BEDO 105 and return to READY B_EDO 106. Termination quad-word aligns the subsequent transfers.

Figure 6A:
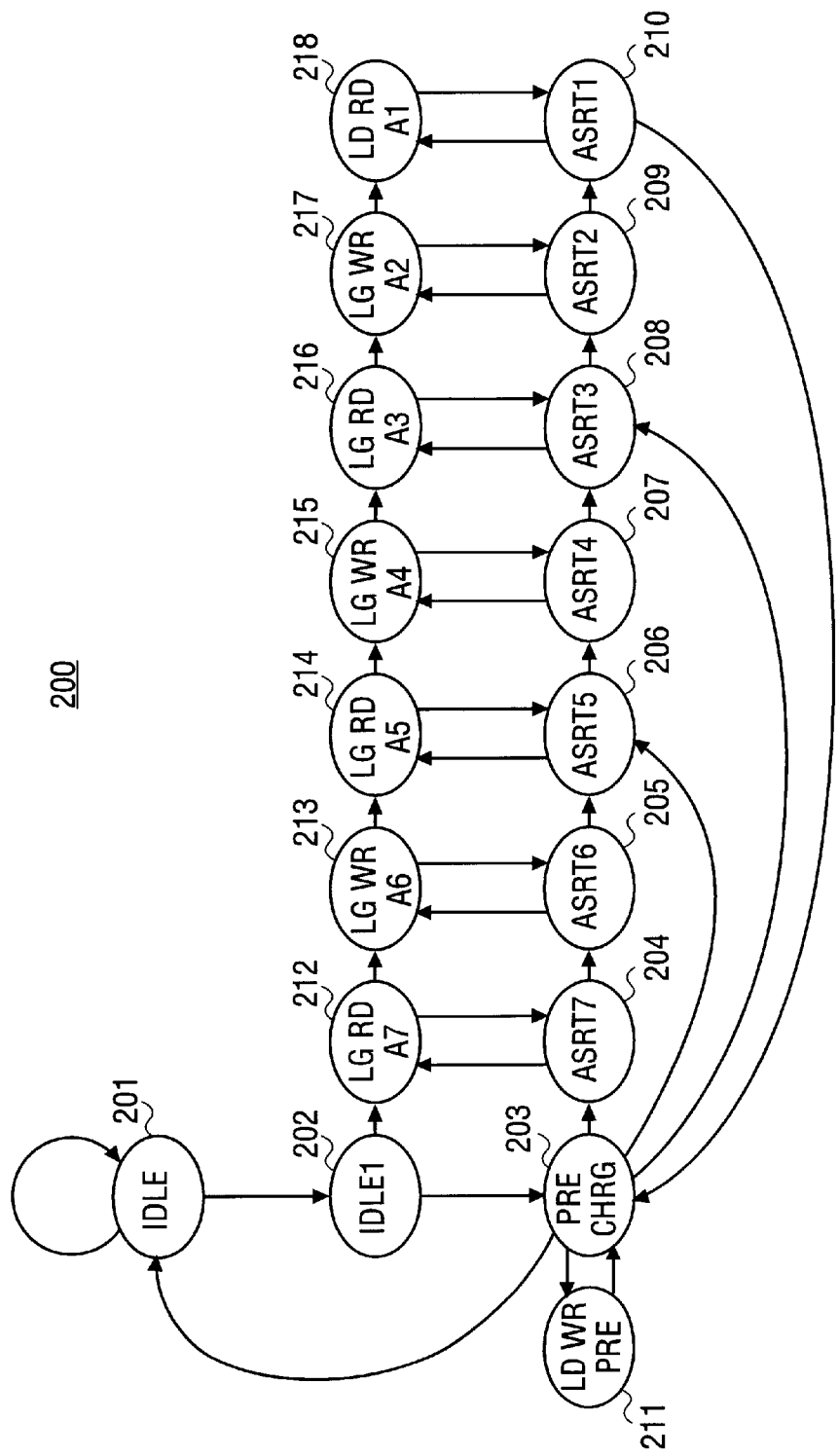
FIG. 6a shows a state diagram for a lead CAS state machine of one embodiment of the invention.
Figure 6B:
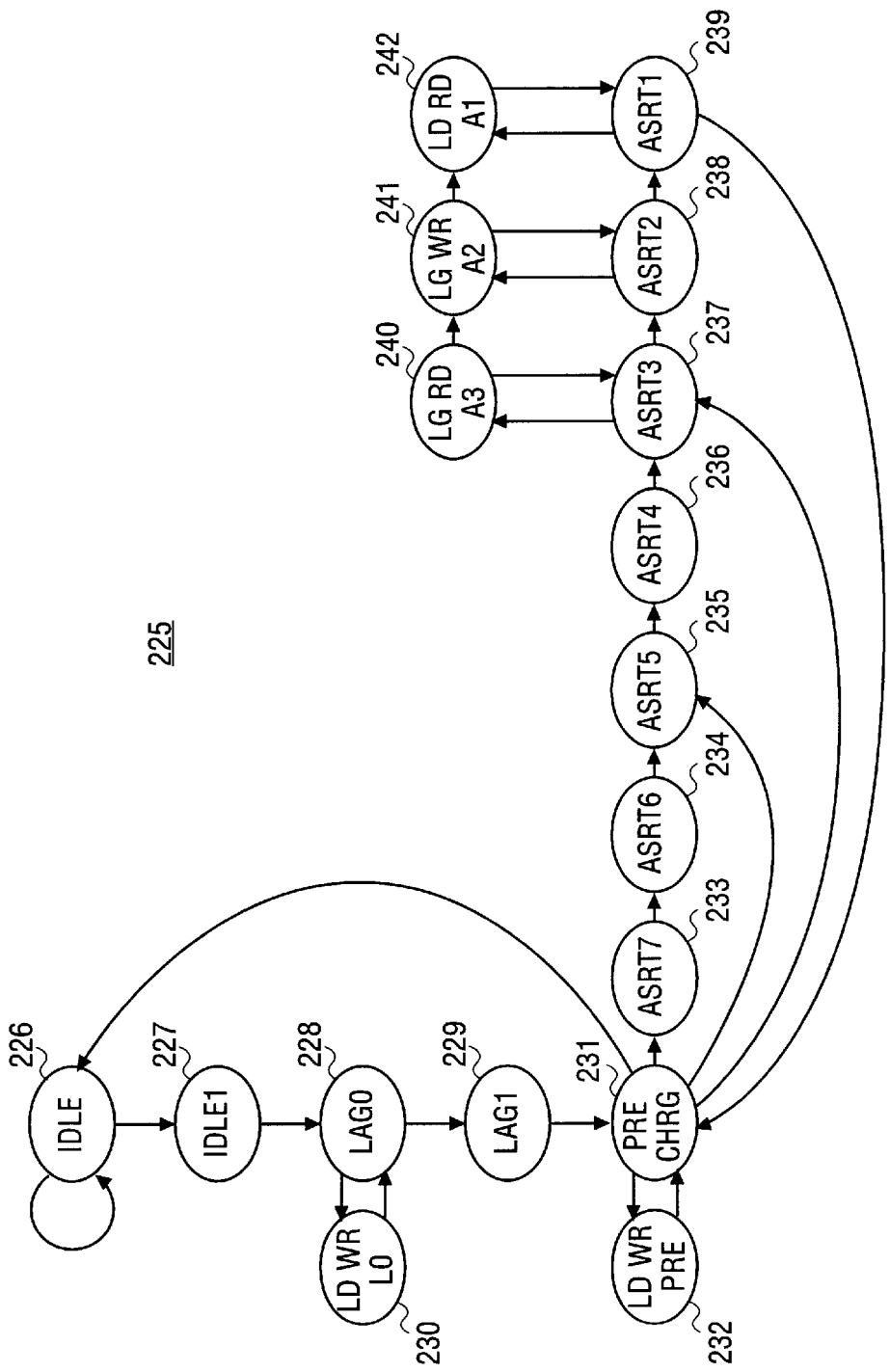
FIG. 6b shows a state diagram of a lag CAS state machine of one embodiment of the invention.
Figure 6C:
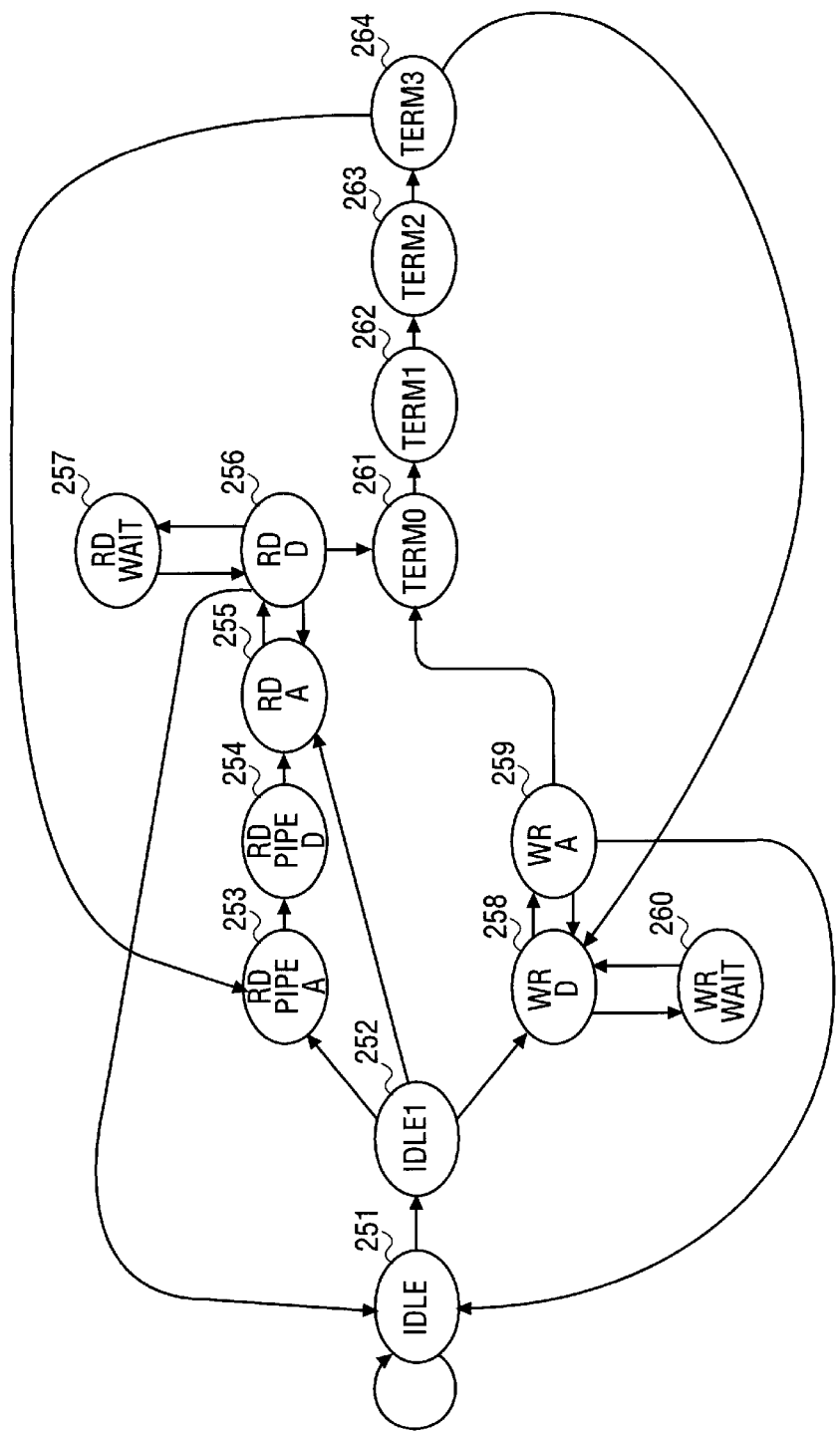
FIG. 6c shows a state diagram of a (B)EDO CAS state machine of one embodiment of the invention.

FIGS. 6a–c show the CAS state machines of one exemplary embodiment of the instant invention. The CAS state machines operate on a clock (L2CK) that is twice the speed of the LCK. The CAS state machines are responsible for the assertion and deassertion of CAS during any transaction. The particular CAS state machine used in any particular system will depend on the DRAM in that system. Each state in the CAS state machine corresponds to one cycle of the L2CK and, accordingly, two states are equal to one cycle of the LCK.

FIG. 6a shows a state diagram of the lead CAS state machine 200 having formatting IDLE state 201 in which the machine resides when no transaction is occurring. When a transaction occurs, the state machine transitions from IDLE state 201 through IDLE1 202 to precharge 203. From precharge 203, the state machine will transition to an assertion state unless the suspend signal is asserted or the transaction finished. If the transaction is finished it will return to IDLE 201. If the suspend signal is asserted, the state machine 200 will bounce back and forth between LEAD WRITE precharge 211 and precharge 203. Seven assertions states ASSERT7-ASSERT1 204–210 are provided to accommodate a wide variety of DRAM and required assertion times. An anticipated typical transaction is from the precharge state 203, the state machine will transition to ASSERT3 208 then to ASSERT2 209 then ASSERT1 210, and back to precharge 203, completing the circuit. As can be seen in FIG. 6a, each assertion stage is provided with a corresponding suspend state. The suspend states 212–218 correspond to the suspension of the transaction at different points. For any particular DRAM suspend can only be asserted at four places, one each corresponding to lag read, lag write, lead read, and lead write. This will be discussed more fully below in connection with the lag CAS state machine. If the suspend signal is asserted during any assert state 204–210 of the lead CAS state machine 200 will bounce between the ASSERT state and its corresponding suspend state. For example, if the suspend signal were asserted, when the Lead CAS state machine was in state ASSERT3 208, the state machine 200 would transition to LAG READ A3 16, the corresponding suspend state. The next L2CK cycle would return to ASSERT3 and if the suspended signal is still asserted on the following L2CK cycle, it would again go to LAG Lead as 216. The nomenclature "LAG READ A3" means that the suspend signal suspended a read of the lag bank and the lead CAS state machine 200 will transition to ASSERT3 on the next clock pulse. The same nomenclature is followed in the other suspend states. The lead CAS state machine handles the lead bank in an interleaved DRAM. Additionally, it is used any time the DRAM does not interleave and does not support EDO or BEDO transactions.

FIG. 6b shows the lag CAS state machine 225. The lag CAS state machine 225 lags the lead CAS state machine by two L2CK cycles. The lag CAS state machine remains in IDLE state 226 when no transaction is being performed or when interleave DRAM is not in use. When a transaction in interleaved DRAM begins, the lag CAS state machine 225 transitions from IDLE state 226 to IDLE1 227 to LAG0 228. In the event that at LAG0 228 the suspend signal is asserted (e.g., first transfer of a write transaction suspended), the state machine 225 will bounce between LAG0 228 and LEAD WRITEL0 230. Otherwise, LAG0 228 of the state machine will transition to LAG1 229 and then to precharge 231. Remaining operations of the lag CAS state machine are analogous to those of the lead CAS state machine. The LAG WRITE PRECHARGE state 232 is provided as well as PRECHARGE 231 in the event the suspend signal is asserted during a write transfer of a transaction. Seven assertion states, ASSERT7-ASSERT1 223–239 are also provided. However, suspend states are only provided at ASSERT3 through ASSERT1 237–239. Following the nomenclature previously discussed, LEAD READ A1 240 indicates that the suspend signal was asserted to suspend a read of the lead state machine 200. This can only occur when the lead CAS state machine 200 is at ASSERT1 210 which implies (since the lag CAS State machine 225 is always lagging by two cycles) that the lag CAS State Machine 225 will always be at ASSERT3 237 when suspend by a lead read. An analogous case exists for LEAD WRITE A2 241.

FIG. 6c shows a state diagram of the (B)EDO CAS state machine. The (B)EDO CAS state machine is employed any time the DRAM supports (B)EDO transactions. The state machine resides in IDLE state 251 when a transaction is not occurring. Once the transaction begins, the state machine transitions into IDLE 252 which branches based on present transaction whether or not the DRAM is BEDO DRAM. Assuming the transactions are write, the state machine transitions to write DEASSERTED 258. At write DEASSERTED 258 a suspend will cause the state machine 250 to bounce between write WAIT 260 and write DEASSERTED 258. If the suspend signal is not asserted, the state machine will bounce between write DEASSERTED 258 and write ASSERTED 259 until a suspend signal is asserted, the transaction is complete or termination is required. If the address of the BEDO and the memory controller address become asynchronous, the state machine will terminate through states 261–264 before transitioning to write deasserted 258. On completion of the transaction, the state machine 250 returns to IDLE 251. Once the suspend signal is asserted during a transaction and the state machine 250 has returned to write DEASSERTED 258, the state machine 250 will bounce back and forth between the write WAIT 260 and write DEASSERTED 258.

If the DRAM is BEDO and the transaction is a read, from IDLE 252, the state machine transitions through read PIPE ASSERTED 253, read PIPE DEASSERTED 254 which allows the set-up of BEDO DRAM as required. Once set-up is complete, the state machine transitions to read ASSERTED 255 and then to read DEASSERTED 256. From read DEASSERTED 256, the assertion of a suspend signal will cause the state machine 250 to bounce between read wait 257 and read DEASSERTED 256. If the transaction is finished, the state machine will transition from read DEASSERTED 256 back to the IDLE state 251. If a BEDO address and the memory controller address become asynchronous, the read DEASSERTED 256, the state machine will transition through termination of states 261–264 before returning to read PIPE ASSERTED 253. If the DRAM is EDO DRAM, the state machine transitions directly from IDLE 252 to read ASSERTED 255 and bounces back and forth between read ASSERTED 255 and read DEASSERTED 256 absent a suspend signal. This suspend signal causes bouncing between read DEASSERTED 256 and read WAIT 257. Of course, when the transaction is complete, the state machine will return from read DEASSERTED 256 to IDLE state 251.

Figure 7:
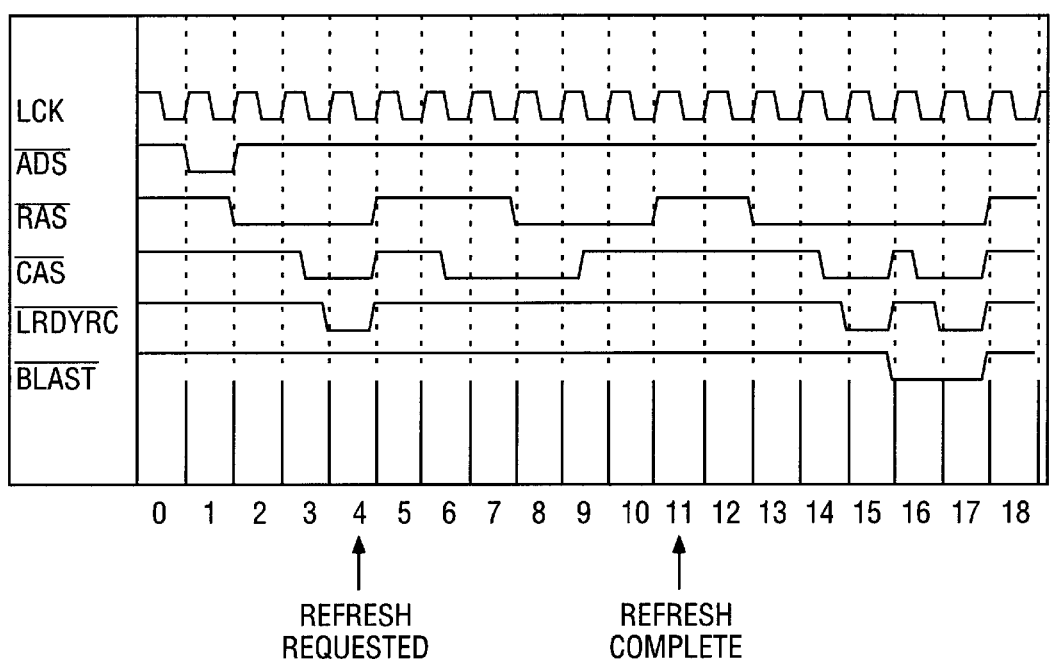
FIG. 7 is a timing diagram showing an example of a mid-transaction refresh.

FIG. 7 shows a timing diagram of a mid-transaction refresh. The diagram shows the LCK signal, the address strobe signal, the RAS signal, the CAS signal, RDY/RCV signal, and BLAST. BLAST is asserted during the last transfer of the transaction. Similar functionalities exist on most systems which support burst operations. The other signals are generally well-known in the art. However, Applicant's unique manipulation of these signals to achieve a mid transaction refresh is unique. In response to a refresh request (not shown) in cycle 4; RAS, CAS, and LRDY/RCV are deasserted in cycle 5. LRDY/RCV is held deasserted throughout the refresh. CAS is asserted one and a half cycles later. RAS is then asserted one and a half cycles after CAS is asserted. CAS is deasserted another one-half cycles later (e.g., CAS is asserted for 3 cycles). RAS is deasserted (e.g., RAS is also asserted for 3 cycles). The refresh is then complete. One of ordinary skill in the art will recognize that the precise number of cycles of assertion is system dependent and accordingly variation of the assertion time for RAS and CAS is within the scope and contemplation of the invention. Once RAS has precharged, the transaction continues in the usual way. The master on the local bus will see the refresh as a series of wait states. Accordingly, the refresh is performed without master participation and is actually transparent to the master. The number of wait states depends on the architecture an DRAM used, ten is typical.

FIGS. 8a–d show timing diagrams of a system employing a WAIT signal as the suspend signal. The other signals shown in the diagram are generally known in the art.

Figure 8A:
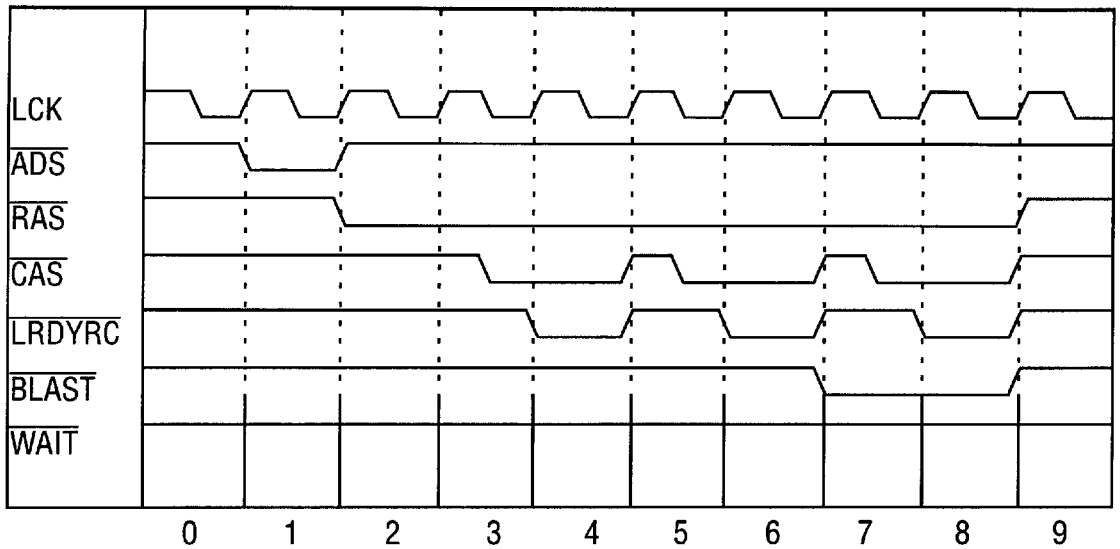
FIGS. 8a–d are timing diagrams of read and write transactions with and without a suspend signal asserted.

FIG. 8a shows a read transaction in which WAIT is not asserted. Accordingly, the transaction proceeds as it would have in the prior art except for the presence of the deasserted WAIT signal.

Figure 8B:
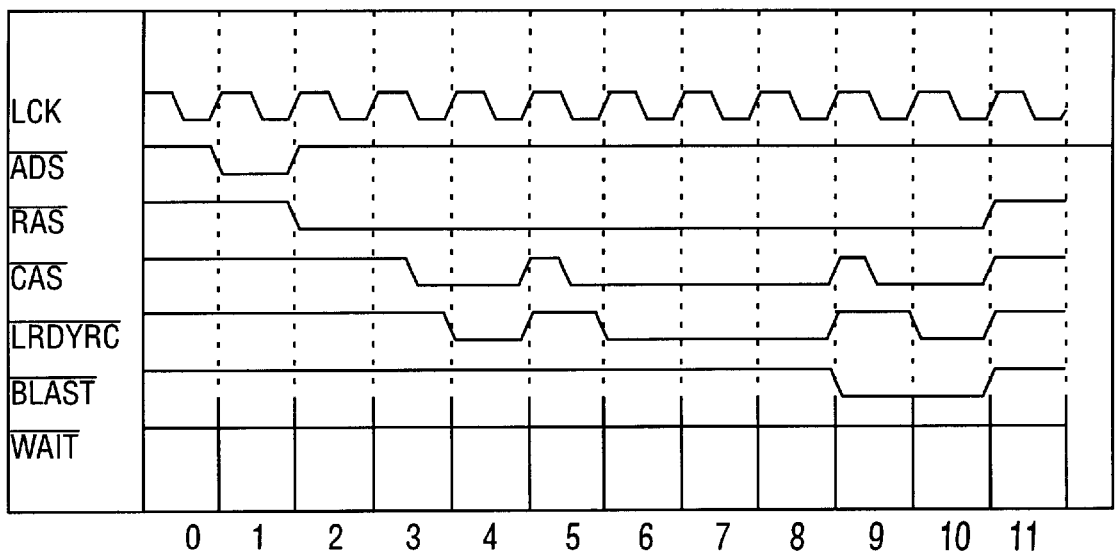

FIG. 8b shows a read transaction with a two-cycle WAIT assertion during cycles 6 and 7. As can be seen by comparing FIGS. 8a and 8b, the WAIT signal has the effect of maintaining the state of the signals as they existed when the WAIT was asserted. This has the effect of shifting the remainder of the transaction by two cycles (since WAIT is asserted for two cycles). Cycles 8–11 of the suspended transaction match cycles 6–9 of the transaction in FIG. 8a in which wait is not asserted.

Figure 8C:
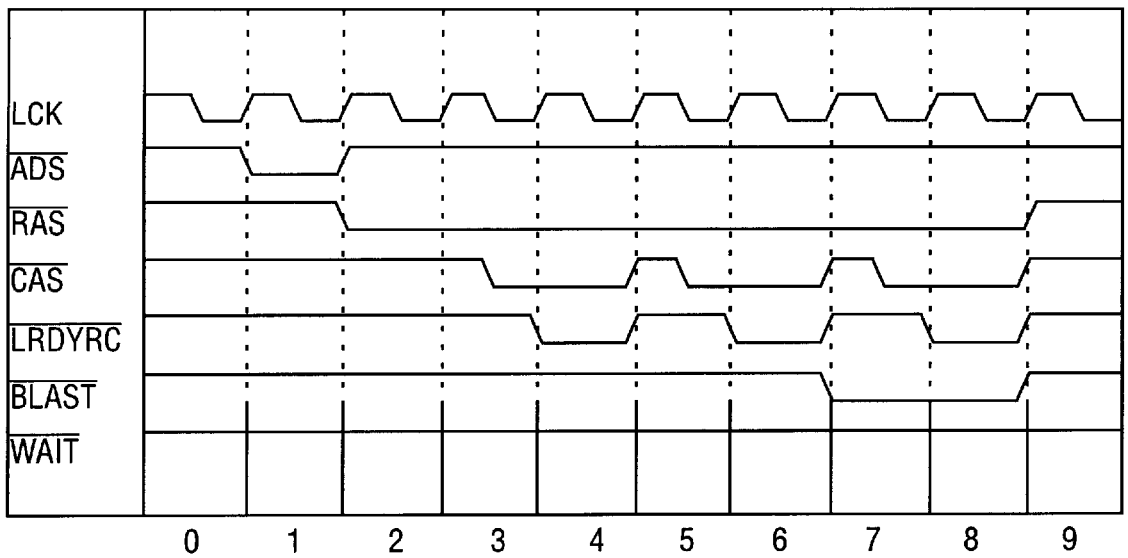

FIG. 8c is a timing diagram of a write transaction during which WAIT is not asserted. Accordingly, it proceeds as a normal prior write transaction, the exception of the presence of the deasserted WAIT signal.

Figure 8D:
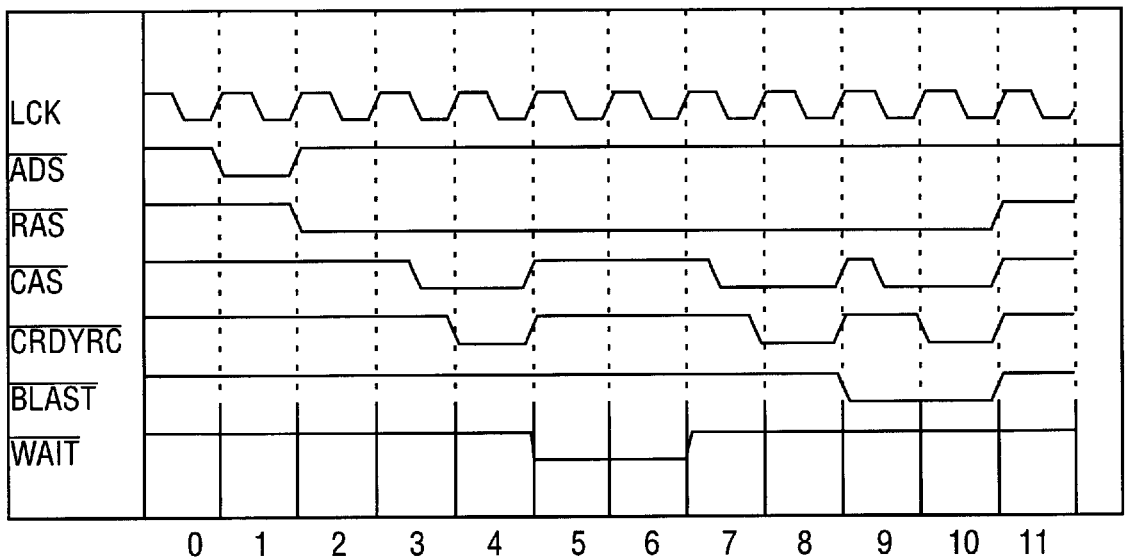

FIG. 8d shows a write transaction in a non-interleaved FPM DRAM with a two cycle WAIT assertion. Again, the assertion of the WAIT signal has the effect of suspending the other signals in their then existing state. The transaction continues when WAIT is deasserted. Significantly, when WAIT is asserted during a write transaction, CAS will be held deasserted for the duration of the suspension and RDY/RCV will maintain its value. Conversely, during a read transaction, CAS and RDY/RCV are held asserted for a duration of the suspension. This difference is a result of the fact that write transactions only recognize a WAIT signal at the beginning of a transfer because writes occur on the falling edge of CAS. Writes typically occur on the falling edge of CAS, so write transactions are only allowed to be suspended when CAS is deasserted (otherwise the write has already occurred). Read data is usually latched to a master near the deassertion of CAS. There is no detriment to maintaining the data on data lines for a longer duration. Accordingly, read transactions are suspended when RCY/RCV and wait are simultaneously asserted.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising:
   a DRAM state machine which performs a refresh of a DRAM during a transaction in which a single master is suspended while retaining control of a local bus, the refresh performed responsive to a refresh request signal;
   a refresh request unit coupled to the DRAM state machine wherein the refresh request unit generates the refresh request signal; and
   a CAS state machine coupled to and initiated by the DRAM state machine, the CAS state machine operating at a clock frequency twice that of the DRAM state machine.

2. The apparatus of claim 1 wherein the refresh is a CAS-before-RAS refresh and wherein the master sees a series of wait slates during the refresh.

3. The apparatus of claim 1 wherein the DRAM state machine asserts a row address strobe (RAS) and inserts a programmable number of wait states before a column address strobe (CAS) can be asserted.

4. The apparatus of claim 1 wherein the DRAM state machine accepts a suspend signal as an output.

5. The apparatus of claim 1 wherein the refresh request unit comprises a resetting counter.

6. A system comprising:
   a local bus;
   a refresh request unit;
   a memory controller coupled to a DRAM and the local bus for controlling access to the DRAM, the memory controller refreshing the DRAM during a transaction in which a single master is suspended while retaining control of the local bus, if the refresh request unit asserts a refresh signal during the transaction indicating a refresh is to be performed, wherein the memory controller delays the refresh until the transaction is completed if when the refresh request signal is asserted, a last transfer of the transaction is occurring and a bursting device is not asserting a suspend signal; and
   the bursting device coupled to the memory controller by the local bus and mastering the local bus, the bursting device reading from the DRAM in bursts and writing to the DRAM in bursts.

7. The system of claim 6 wherein the refresh request unit comprises a counter.

8. The system of claim 7 wherein the counter to a predetermined number before asserting a refresh request.

9. The system of claim 6 wherein the memory controller performs a CAS-before-RAS refresh responsive to the refresh request signal.

10. The system of claim 9 wherein the bursting device sees a series of wait states while the CAS-before-RAS refresh is being performed, and the transaction resumes once the refresh is complete.

11. A method of refreshing a DRAM during a transaction comprising:
   causing a single master to wait while said single master retains control of a local bus during a mid transaction refresh;
   delaying the refresh until the transaction is complete if when a refresh request signal is asserted a last transfer of the transaction is occurring and the master is not asserting a suspend signal;
   showing wait states to the master during said mid transaction refresh;

deasserting a CAS for a current transfer of the transaction;

deasserting a RAS for the current transfer of the transaction;

precharging the RAS;

performing a CAS-before-RAS refresh;

reprecharging RAS; and restarting access to the DRAM.

12. The method of claim 11 further comprising:
asserting the refresh request signal when the transaction exceeds a predetermined length.

13. The method of claim 11 further comprising:
preserving a row address when RAS is deasserted, and wherein the step of restarting comprises the step of asserting the RAS with the preserved row address.

* * * * *

UNITED STATES PATENT AND TRADEMARK OFFICE
CERTIFICATE OF CORRECTION

PATENT NO. : 6,125,425
DATED : September 26, 2000
INVENTOR(S) : Cole et al.

It is certified that error appears in the above-identified patent and that said Letters Patent is hereby corrected as shown below:

Column 4,
Line 3, delete "39", insert -- 29 --.

Column 8,
Line 3, delete "223-239", insert -- 233-239 --.

Signed and Sealed this

Eighteenth Day of June, 2002

Attest:

Attesting Officer

JAMES E. ROGAN
*Director of the United States Patent and Trademark Office*